(12) United States Patent
Okada (10) Patent No.: US 9,466,947 B2
(45) Date of Patent: Oct. 11, 2016

(54) SEMICONDUCTOR LASER DIODE WITH SHORTENED CAVITY LENGTH

(71) Applicant: Sumitomo Electric Device Innovations, Inc., Yokohama-shi (JP)

(72) Inventor: Nobumasa Okada, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/830,596

(22) Filed: Aug. 19, 2015

(65) Prior Publication Data

US 2016/0056614 A1    Feb. 25, 2016

(30) Foreign Application Priority Data

Aug. 22, 2014   (JP) .................... 2014-169819

(51) Int. Cl.
| | |
|---|---|
| *H01S 5/22* | (2006.01) |
| *H01S 5/10* | (2006.01) |
| *H01S 5/028* | (2006.01) |
| *H01S 5/02* | (2006.01) |
| *H01S 5/042* | (2006.01) |
| *H01S 5/12* | (2006.01) |

(52) U.S. Cl.
CPC ................ *H01S 5/22* (2013.01); *H01S 5/028* (2013.01); *H01S 5/1039* (2013.01); *H01S 5/0202* (2013.01); *H01S 5/0425* (2013.01); *H01S 5/1209* (2013.01)

(58) Field of Classification Search
CPC ........................................................ H01S 5/22
See application file for complete search history.

(56) References Cited

U.S. PATENT DOCUMENTS 4,868,838 A  *  9/1989  Yamamoto ............ H01S 5/2232
                                                           372/45.01

FOREIGN PATENT DOCUMENTS

JP         H05-029703 A     2/1993

* cited by examiner

*Primary Examiner* — Dung Nguyen
(74) *Attorney, Agent, or Firm* — Venable LLP; Michael A. Sartori; F. Brock Riggs (57) ABSTRACT

A semiconductor laser diode (LD) with a shortened cavity length is disclosed. The LD provides a rectangular substrate and, on the substrate, a cavity structure including a mesa with facets forming the laser cavity. The facets of the mesa are stood back from the side of the substrate. Pads to provide electrical signals are arranged in both sides of the mesa close to the sides of the substrate.

10 Claims, 11 Drawing Sheets

SEMICONDUCTOR LASER DIODE WITH SHORTENED CAVITY LENGTH

BACKGROUND OF THE INVENTION

1. Field of the Invention

The present application relates to a semiconductor laser diode (LD), in particular, to an LD with a shortened cavity length.

2. Related Background Arts

An optical communication usually implements an LD as an optical signal source. As the capacity of the optical communication system drastically increases, the optical source is requested to modulate signals faster as long as possible. Recent communication systems request the modulation speed exceeding 15 GHz, sometimes reaching 30 GHz. For such high speed modulations, conventional LDs with the edge-emitting type have been requested to shorten the cavity length thereof, because, the high speed operation of an LD very strongly depends on the cavity length. However, because of the productivity of au LD, the cavity length thereof is restricted to a few hundreds of micronmeters. The present application is to provide one solution for such an LD with shortened cavity length.

SUMMARY OF THE INVENTION

An aspect of the present application relates to a semiconductor laser diode (LD) that provides an optical axis along which laser light is emitted. The LD comprises a rectangular semiconductor substrate and a mesa that includes an active layer to generate the laser light. The mesa extends along the optical axis and has two facets in respective ends thereof. The facets define a cavity for the laser light. A feature of the LD of the present application is that the facets of the mesa are stood back from respective edges of the substrate each perpendicular to the optical axis, accordingly, the cavity length of the LD may be shortened with respect to the longitudinal length of the substrate. That is, the present invention may shorten the cavity length without reducing the size of the LD, which makes the handling during the production of the LD easy.

BRIEF DESCRIPTION OF DRAWINGS

A more detailed understanding may be had from the following description, given by way of example in conjunction with the accompanying drawings wherein.

DESCRIPTION OF EMBODIMENTS

Next, some embodiments according to the present application will be described as referring to accompanying drawings. In the description of the drawings, numerals or symbols same with or similar to each other will refer to elements same with or similar to each other without duplicating explanations.

First Embodiment

Figure 1:
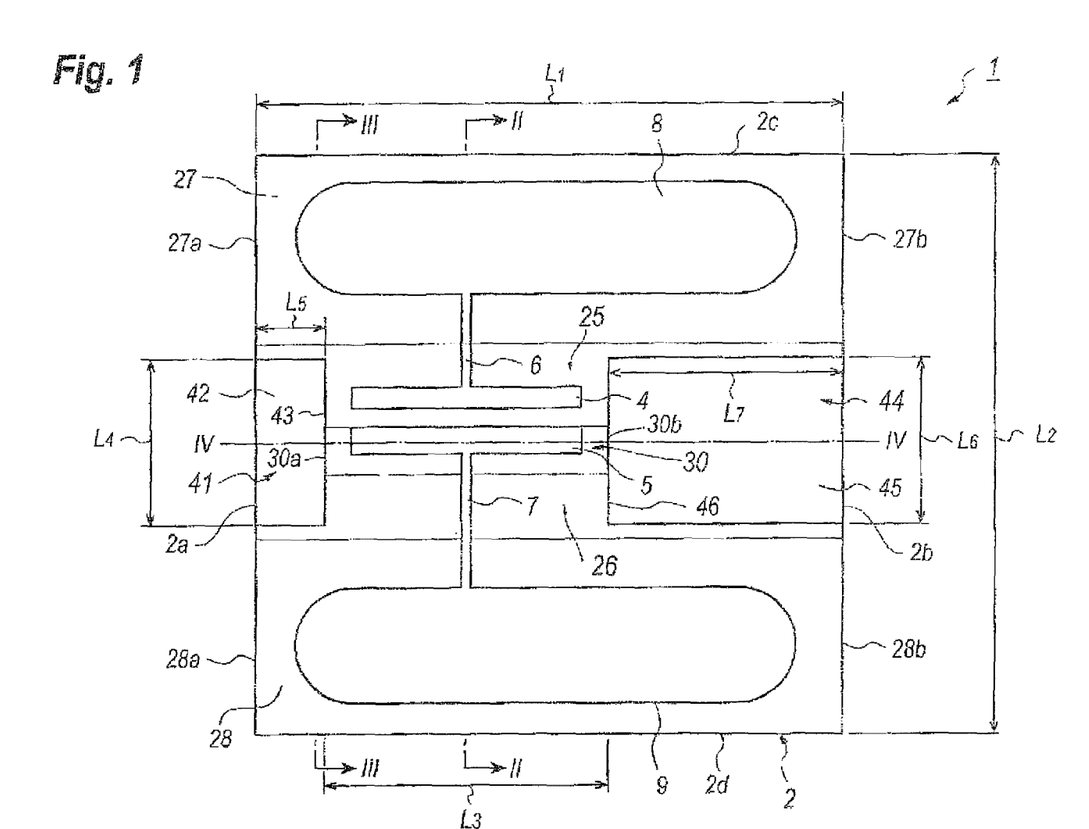
FIG. 1 is a plan view of an LD according to the first embodiment.
Figure 2:
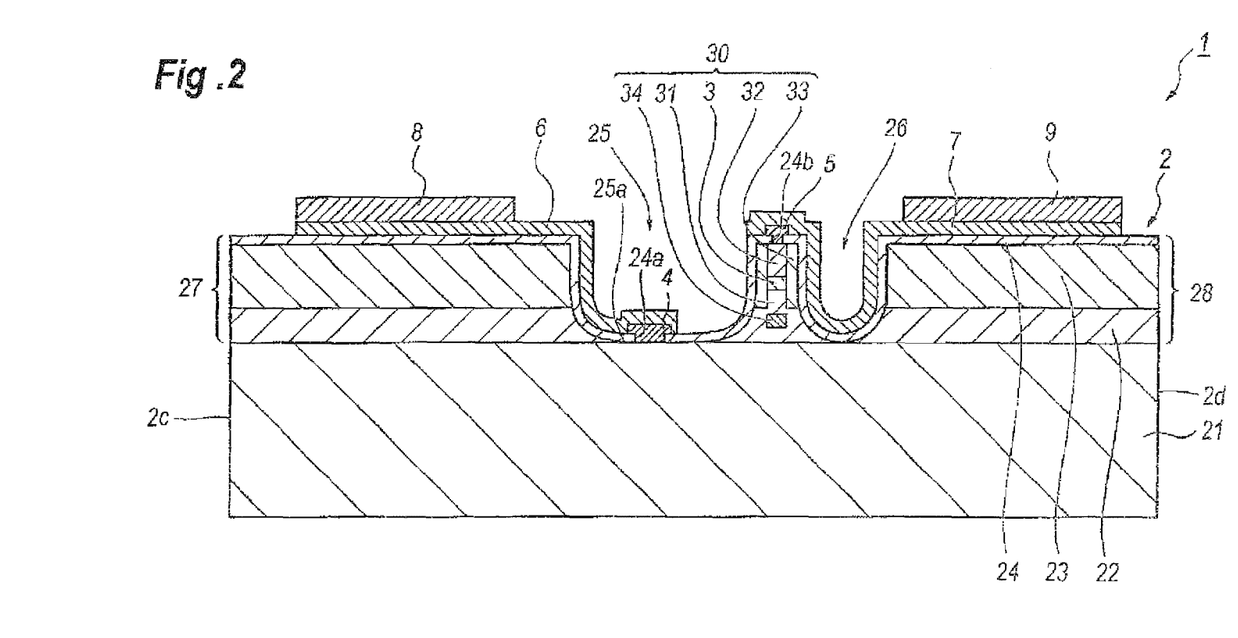
FIG. 2 shows a cross section of the LD taken along the line II-II indicated in FIG. 1.
Figure 3:
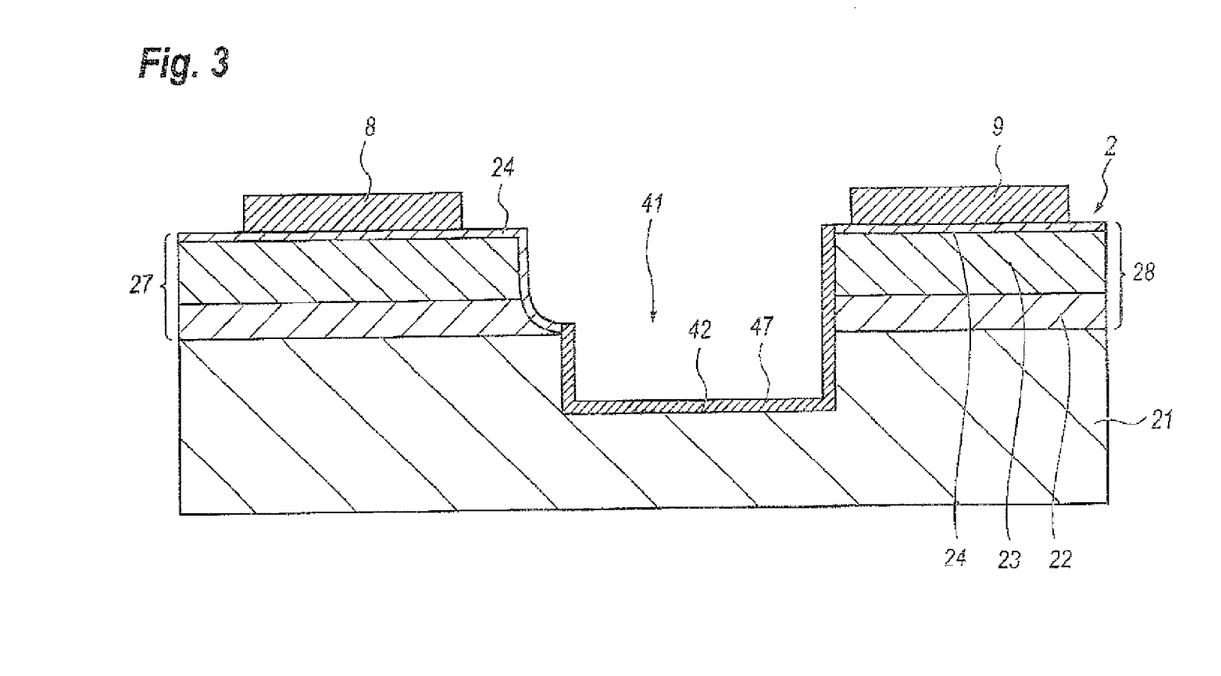
FIG. 3 shows a cross section of the LD taken along the line III-III indicated in FIG. 1.
Figure 4:
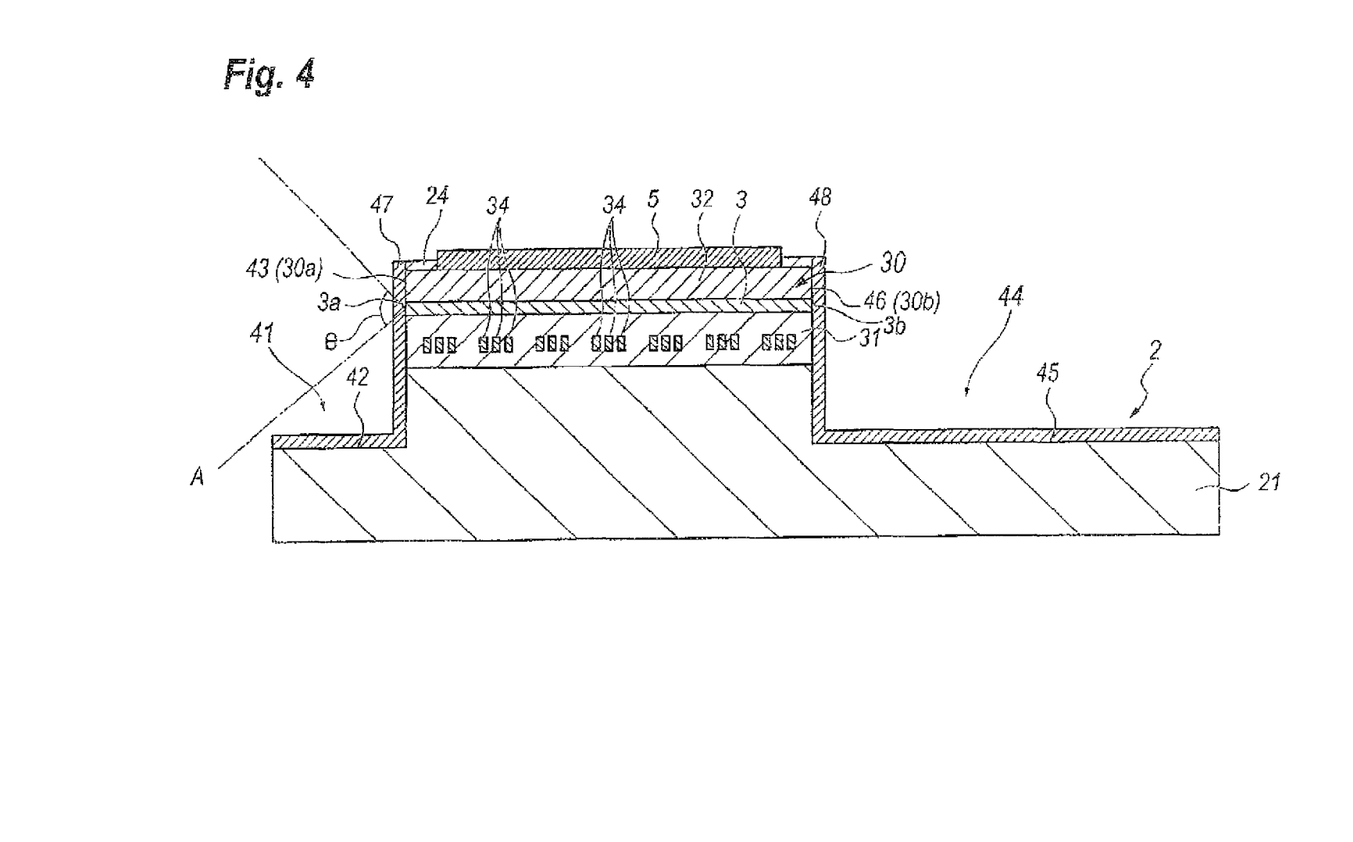
FIG. 4 shows a cross section of the LD taken along the line IV-IV indicated in FIG. 1.

FIG. 1 schematically shows a plan view of a semiconductor laser diode (LD) 1, FIG. 2 shows a cross section of the LD taken along the line II-II appearing in FIG. 1, FIG. 3 shows another cross section of the LD 1 taken along the line III-III indicated in FIG. 1, and FIG. 4 shows still another cross section of the LD 1 taken along the line IV-IV indicated in FIG. 1. As illustrated in FIG. 2, the LD 1 of the embodiment provides, on a semiconductor substrate 21, an active layer 3, electrodes, 4 and 5, interconnections, 6 and 7, and pads, 8 and 9. The semiconductor substrate 21 may be made of n-type InP with a thickness of 100 to 200 µm.

As shown in FIG. 1, the LD 1 has an LD body 2 with a rectangular plane shape formed by edges, 2a to 2d, where two edges, 2a and 2b, face to each other, and other two edges, 2c and 2d, also face to each other extending along a direction perpendicular to the former two edges, 2a and 2b. The edges, 2c and 2d, may have a length of 200 to 500 µm, while, the other two edges, 2a and 2b, may have a length of also 200 to 500 µm. The present LD body 2 shown in FIG. 1 has a length for respective edges, 2a to 2d, of 300 µm.

As shown in FIG. 2, the LD body 2 provides, on the semiconductor substrate 21, a lower cladding layer 22, an embedding layer 23, and an insulating film 24. The lower cladding layer 22, which is provided on the semiconductor substrate 21, may be made of an n-type InP with a thickness of about 1 µm. The embedding layer 23, which is provided on the lower cladding layer 22, may have a stack of a p-type InP layer, an n-type InP layer, and a p-type InP layer with a total thickness of about 3 µm. The insulating film 24, which covers the semiconductor substrate 21, the lower cladding layer 22, and the embedding layer 23, may be made of silicon oxide ($SiO_2$), silicon nitride (SiN), and so on with a thickness of about 0.5 µm.

The LD body 2 provides a pair of grooves, 25 and 26, extending along the optical axis of the LD 1 by removing a portion of the cladding layer 22, and a portion of the embedding layer 23. The grooves, 25 and 26, has a depth of about 15 µm, and a width of one of the grooves 25 is greater than a width of the other of the grooves 26. The insulating film 24 covers the sides and the bottom of the grooves, 25 and 26, but has an opening 24a in the bottom 25a of the groove 25 to expose a surface of the semiconductor substrate 21. An electrode 4 fills the opening 24a; that is, the electrode 4 comes in contact to the semiconductor substrate 21 through the opening 24a, which means that the electrode 4 is electrically connected to the active layer 3 through the semiconductor substrate 21. The electrode 4 may be made of eutectic metal of AuZn or an alloy containing AuZn.

An area between the grooves, 25 and 26, provides a mesa 30, which is a resonant structure for the laser emission, with a longitudinal length $L_3$ along the optical axis of the mesa 30 is shorter than a length $L_1$ of the LD body 2; specifically, the mesa 30 has the longitudinal length $L_3$ of 50 to 150 µm. The mesa 30 includes the lower cladding layer 31, the upper cladding layer 32, the active layer 3, the embedding layer 33, and an optical grating 34. The lower cladding layer 31 may be made of n-type InP, which is the same as the lower cladding layer 23 out of the mesa 30. The upper cladding layer 32, which is put above the active layer 3, has a thickness of, for instance, 1.5 µm. The embedding layer 33 has a structure same as that of the embedding layer 23 out of the mesa 30. The optical grating 34 exists within the lower cladding layer 31 so as to overlap with the active layer 3 and has a refractive index different from that of the lower cladding layer 31. In an example, when the lower cladding layer 31, as described above, is made of an n-type InP, the optical grating may include InGaAsP. The mesa 30 is put between two facets, 30a and 30b, where one facet 30a exits in the side of the edge 2a, while, the other facet 30b exist in another side of the edge 2b opposite to the former edge 2a. Two facets, 30a and 30b, of the mesa 30 are respectively stood back from the edges, 2a and 2b, of the LD body 2.

The active layer 3 is an optical waveguide layer with a stripe extending along the optical axis, refer to FIG. 4. The active layer 3 has a length along the optical axis nearly equal to the length $L_3$ of the mesa 30, that is, the longitudinal length of the active layer 3 is shorter than the longitudinal length $L_1$ between two edges, 2a and 2b, of the LD body 2. As illustrated in the cross section of FIG. 2, the active layer 3 is put between two cladding layers, 31 and 32, and also covered in respective sides thereof by the embedding layer 34. The active layer 3 may have a thickness of 0.2 µm, and a multi-quantum well (MWQ) structure including a plurality of InGaAsP layers.

The insulating film 24 provides an opening 24b above the active layer 3 to expose the upper cladding layer 32. The electrode 5 covers this opening 24b. That is, the electrode 5 is provided above the active layer 3 as interposing the upper cladding layer 32. The electrode 5, which injects carriers into the active layer 3 through the upper cladding layer 32, may be made of eutectic alloy such as gold-zinc (AuSn), intrinsic metal, and/or alloy of those metals. The electrode 5 is supplied with a modulation signal and/or a bias current through the interconnection 7.

The interconnection 6 laterally extends in perpendicular to the optical axis of the LD 1 from the groove 25 to the embedding layer 23 in the edge 2c of the LD body 2. The interconnection 6 may be primarily made of gold (Au) with a thickness of 20 to 50 µm. The interconnection 6 in one end thereof is connected to the electrode 4 provided in the groove 25, while, the other end thereof is connected to the pad 8. Thus, the interconnection 6 electrically couples the electrode 4 with the pad 8.

The pad 8 is provided on the embedding layer 23 in the side of the edge 2c of the LD body 2, and has a horizontal level thereof higher than the active layer 3. Specifically, as illustrated in FIG. 1, the pad 8 locates between the groove 25 and the edge 2c, and on an area 27 constituted by the lower cladding layer 22, the embedding layer 23, and the insulating film 24. The area 27 is demarcated by the sides, 27a and 27b, where these sides, 27a and 27b, are common to the edges, 2a and 2b, of the LD body 2 respectively. Thus, a distance between two sides, 27a and 27b, is longer than the distance between two facets, 30a and 30b, of the mesa 30. The pad 8 has a longitudinal length along the optical axis of the LD 1 longer than a lateral width thereof perpendicular to the optical axis and a longitudinal length of the mesa 30. The longitudinal length of the pad 8 may be 100 to 300 µm, while the lateral width thereof may be 50 to 150 µm. A bonding wire is to be connected to the top of the pad 8.

The other interconnection 7, which extends from the electrode 5 to the other pad 9 as crossing the groove 26 along the direction perpendicular to the optical axis of the LD 1, may be also made of gold (Au), metal alloy primary containing Au, or metal stack coated with gold (Au), with a thickness of 100 to 300 µm. Because the interconnection 7 carries a modulation signal accompanied with a bias current, the interconnection 7 may match impedance thereof with that of the mesa 30 according to the length and width thereof. One end of the interconnection 7 exists on the top of the mesa 30, while, the other end is coupled with the pad 9. Thus, the interconnection 7 electrically connects the electrode 30 with the pad 9.

The pad 9, similar to the former pad 8, exists on an area 28 in the side of the edge 2d of the LD body 2 and has the horizontal level thereof higher than that of the active layer 3. Specifically, as illustrated in FIG. 1, the pad 9 exists between the groove 26 and the edge 2d, on the area 28 constituted by the lower cladding layer 22, the embedding layer 23, and the insulating film 24. The area 28 is demarcated by two ends, 28a and 28b, overlapping with the edges, 2a and 2b, respectively. Thus, a distance between two ends, 28a and 28b, is longer than the longitudinal length $L_3$ between two facets, 30a and 30b, of the mesa 30. The pad 9 has a longitudinal length along the optical axis greater than a lateral width thereof perpendicular to the optical axis, and also greater than, the longitudinal length $L_3$ of the mesa 30. The pad 9 may have the longitudinal length of 100 to 300 µm, and the lateral width of 50 to 150 µm. Bonding wires are to be bonded onto the pad 9 to provide a modulation signal and a bias current thereto.

The edge 2a provides a depression 41 by removing a center portion between two edges, 2c and 2d, of the semiconductor substrate 21, the lower cladding layer 22, the embedding layer 23, the insulating film 24, and the mesa 39, which means that the depression 41 forms a hollow between two edges, 2c and 2d. Also, the depression 41 has a depth greater than a depth of the grooves, 25 and 26, because the depression 41 is formed by etching a portion of the semiconductor substrate 21. The depression 41 may have a depth of, for instance 60 µm.

The depression 41 has a bottom 42 of a rectangular shape with a lateral width $L_4$ of about 100 µm and a longitudinal length $L_5$ of about 50 µm along the optical axis. In the present embodiment, a distance from the bottom 42 of the depression 41 to the interface between the lower cladding layer 22 and the active layer 3, which means the horizontal level of the active layer 3 measured from the bottom 42 of the depression 41, is also about 50 µm. Referring to FIG. 4, the radiation angle θ of light A emitted from the light-emitting facet 3a of the active layer 3 is about 80°, the depression 41 having the physical dimensions above described does not interfere with the light A.

The end surface 43 of the depression 41 includes the facet 30a of the mesa 30, namely, the deep end surface 43 of the hollowed depression 41 is common to the facet 30a of the mesa 30, and also the light-emitting facet 3a of the active layer 3.

The other edge 2b of the LD body 2 also provides a depression 44 whose arrangements are similar to the former depression 41. The depression 44 has a depth substantially equal to the depth of the depression 41. The depression 44 also has a rectangular shape with a lateral width $L_6$ of about 100 µm and a longitudinal length $L_7$ of about 100 to 400 µm.

The deep end surface 46 of the hollowed depression 44 is common to the facet 30b of the mesa 30 and to the facet 3b of the active layer 3.

As illustrated in FIG. 4, a coating 47 covers the end surface 43 and the bottom 42 of the hollowed depression 41, and a coating 48 covers the end surface 46 and the bottom 45 of the hollowed depression 44. The coatings, 47 and 48, may be a stack including titanium oxide film ($TiO_x$ film) and aluminum oxide film ($AlO_x$ film), where they a transparent for the light emitted from the active layer 3. The coatings, 47 and 48, may include a plurality of $TiO_x$ films and $AlO_x$ films, or any other films transparent for the light. The coatings, 47 and 48, may have a thickness of 0.1 to 1.5 μm. The coatings, 47 and 48, have a function of an anti-reflection (AR) film for the light emitted from the active layer 3.

Next, a process to produce the LD 1 will be described, in particular, the process to form the depression, 41 and/or 44, will be described as referring to FIGS. 5A to 5C, and FIGS. 6A and 6B, where these figures show cross sections of the LD 1 in respective depressions.

Figure 5A:
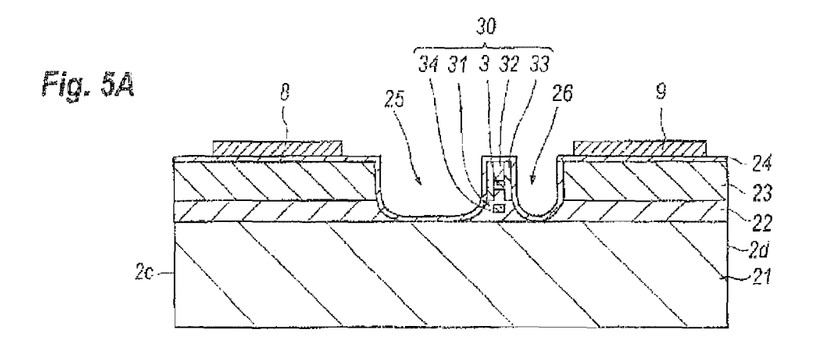
FIGS. 5A to 5C show cross sections of the process to form the LD shown in FIG. 1.
Figure 5B:
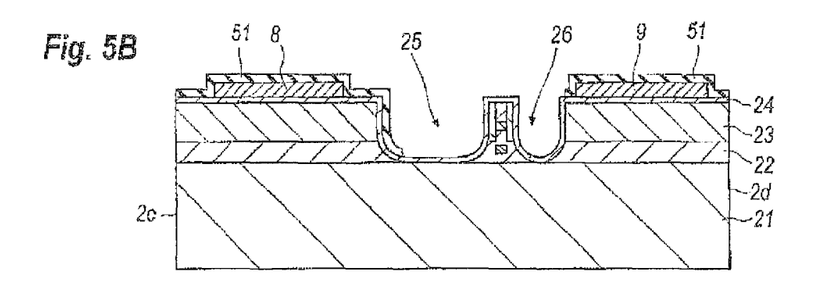
Figure 5C:
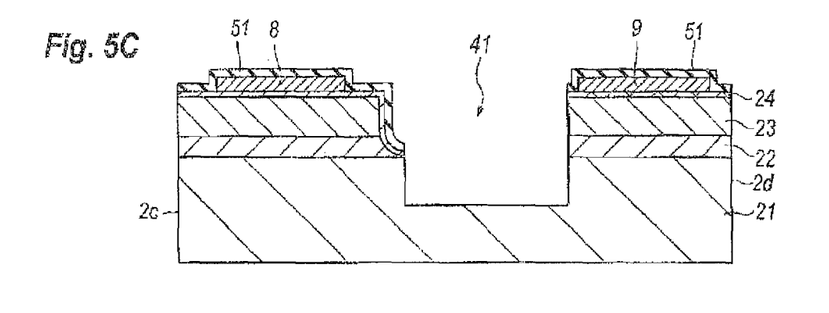
Figure 6A:
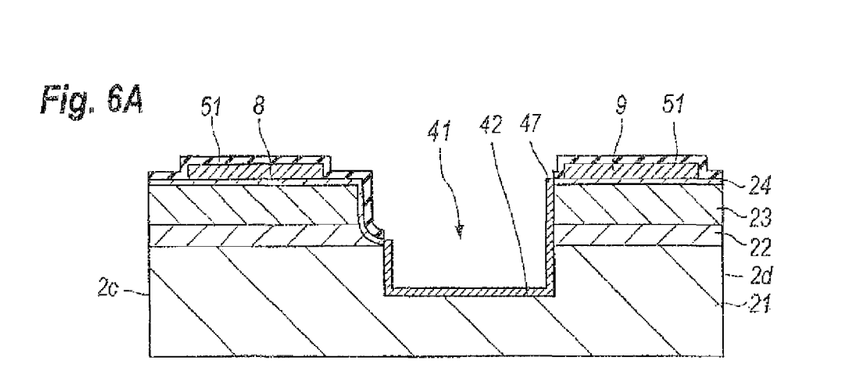
FIGS. 6A and 6B show cross sections of the process subsequent to the process shown in FIG. 5C.
Figure 6B:
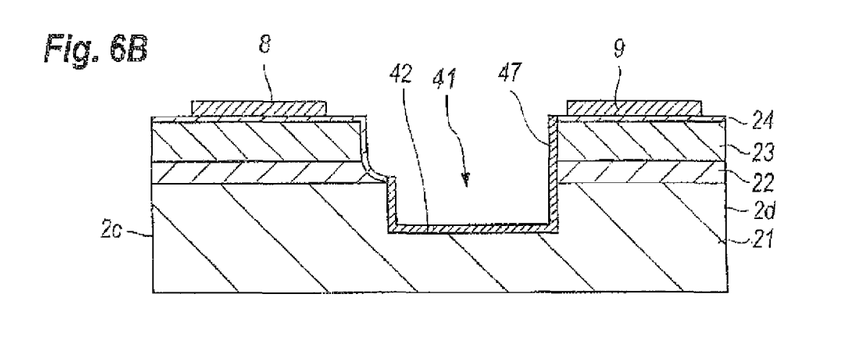

First, as shown in FIG. 5A, a conventional technique may form the LD body 2 that provides the mesa 30 formed by two grooves, 25 and 26, in respective sides thereof; and the electrodes, 4 and 5, the pads, 8 and 9, on the embedding layer 23 in respective outer sides of the grooves, 25 and 26, and the interconnections, 6 and 7, connecting the electrodes, 4 and 5, to the pads, 8 and 9. The process of the embodiment next covers the whole surface of the LD body 2 by an inorganic film 51, typically silicon oxide ($SiO_2$) and/or silicon nitride (SiN) with a thickness of about 100 nm. The inorganic film 51 is then partially removed so as to expose portions where the depressions, 41 and 44, are to be formed by sequential processes of a conventional photolithography to exposes the top of the inorganic material in the areas corresponding to the depressions, 41 and 44; then, the exposed inorganic film 51 is etched. Then, the process removes portions of the mesa 30 and the semiconductor substrate 21 by the inorganic film 51 as the etching mask, which forms the facet 30a of the mesa 30 including the light-emitting facet 3a, and the other facet 30b of the mesa 30. The processes above described are carried out for a condition where the LD body 2 is not divided in respective chips. That is, the processes are performed for a semiconductor wafer.

Then, the process forms a chip bar by cleaving the semiconductor wafer along the lateral direction to from edges, 2a and 2b, of the LD body 2 and to expose the end surfaces, 43 and 46, of the depressions, 41 and 44. That is, the chip bar includes a plurality of LD bodies 2 in an array. Because the LD body 2 has a relatively greater length, typically at least twice of the longitudinal length of the mesa 30, the cleaving of the semiconductor wafer may be easily performed.

Then, the process deposits the coating 47 on the end surface 43 of the hollowed depression 41. Specifically, the chip bar is set within a vacuum chamber for the evaporation as the end facets 47 thereof faces the source material of the evaporation. Evaporating TiO and AlO alternately at a temperature of 250° C. and a pressure of $5 \times 10^{-3}$ Pa, the coating 47 may be deposited on the end surface 43. Concurrently with the end surface 43, the bottom 42 and the sides continuous to the end surface 30a are coated with the material with a thickness thereof less than the coating 47 on the end surface 30a. The other end facet 30b is also covered with the coating 48 by the process same with those described above. Thus, the end facets, 30a and 30b, the bottoms, 42 and 45, and side walls forming the hollowed depressions, 41 and 44, are covered with coatings, 47 and 48.

The LD 1 thus formed has advantages described below. First, the mesa 30 including the active layer 3 is demarcated along the optical axis by the two facets, 30a and 30b, each including the light-emitting facets, 3a and 3b; and these two facets, 30a and 30b, stand back from the edges, 2a and 2b, of the LD body 2. This means that the length $L_3$ of the mesa 30 is shorter than the longitudinal length $L_1$ of the LD body 2, which enables not only the handling of the LD body 2 easy during the manufacturing process but the cavity length of the LD 1 shorter. The invention of the present application may provide an LD of the type of the edge-emitting with a shortened cavity length; that is, an LD showing higher resonant frequency and capable of being modulated by higher frequencies.

Also, the pads, 8 and 9, are arranged in respective sides of the mesa 30 and may have respective lengths greater than the longitudinal length $L_3$ of the mesa 30. That is, the longitudinal lengths of the pads, 8 and 9, are independent of the longitudinal length $L_3$ of the mesa 30. Even when the pads, 8 and 9, are bonded with two or more bonding wires, the pads, 8 and 9, may provide enough area for such a wire-boding.

The depressions, 41 and 44, are formed in respective center portions of the edges, 2a and 2b, of the LD body 2. The lateral widths, $L_4$ and $L_6$, of the depressions, 41 and 44, are only necessary not to interfere with the light emitted from the light-emitting facets, 3a and 3b, of the active layer 3, respectively. Accordingly, areas with enough thicknesses are left between the depressions, 41 and 44, and respective edges, 2c and 2d, the LD body 2 may secure enough strength.

Second Embodiment

Next, another LD according to the second embodiment of the present application will be described.

Figure 7:
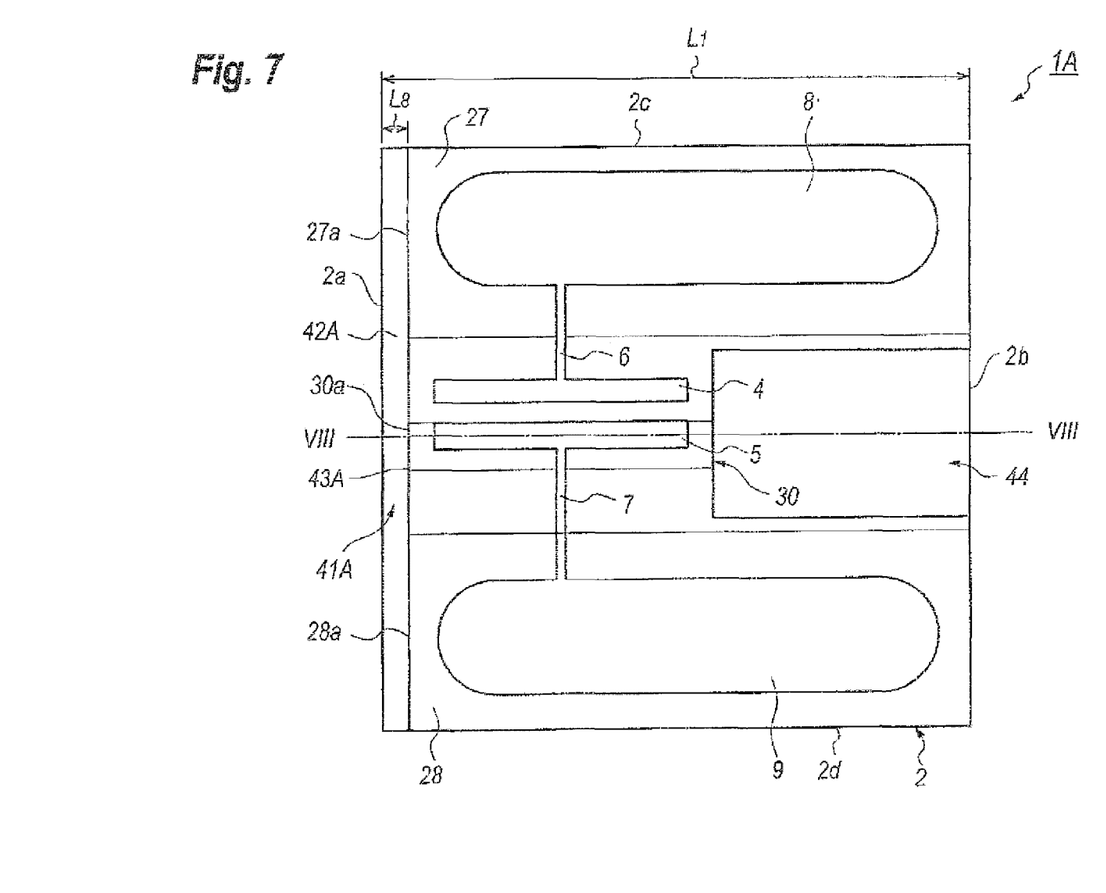
FIG. 7 is a plan view of another LD according to the second embodiment.
Figure 8:
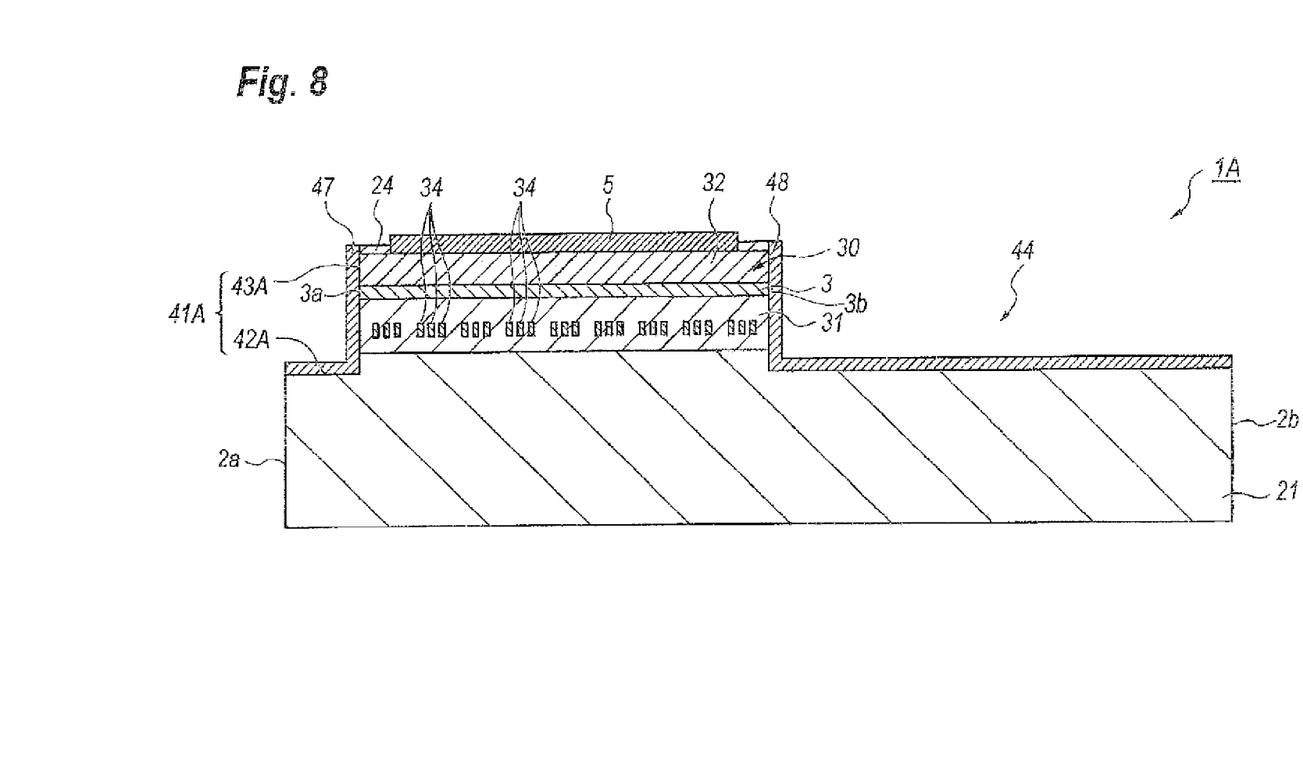
FIG. 8 shows a cross section of the LD shown in FIG. 7, which is taken along the line VIII-VIII appearing in FIG. 7.

FIG. 7 is a plan view of an LD 1A of the second embodiment, and FIG. 8 is a cross section thereof taken along the line VIII-VIII indicated in FIG. 7. The LD 1A shown in FIGS. 7 and 8 has a feature that the depression 41A in the side of the edge 2a of the LD body 2 wholly extends from the edge 2c to the other edge 2d. That is, the lateral width of the bottom 42A of the depression 41A coincides with the lateral width of the LD body 2. The longitudinal length $L_8$ along the optical axis is, for instance, 15 μm, which is substantially equal to the level of the active layer 3 measured from the bottom 42A of the depression 41A. The facet 30a of the mesa 30 including the light-emitting facet 3a of the active layer 3 is common to the end surfaces 27a of the area 27 and the end surface 28a of the area 28, provided in respective sides of the mesa 30, on which the pads, 8 and 9, are formed. Because the depression 41A exists in the whole edge 2a of the LD body 2, the process to fain the depression 41A may be simplified and the shape of the depression 41A may be precisely controlled.

Third Embodiment

Figure 9:
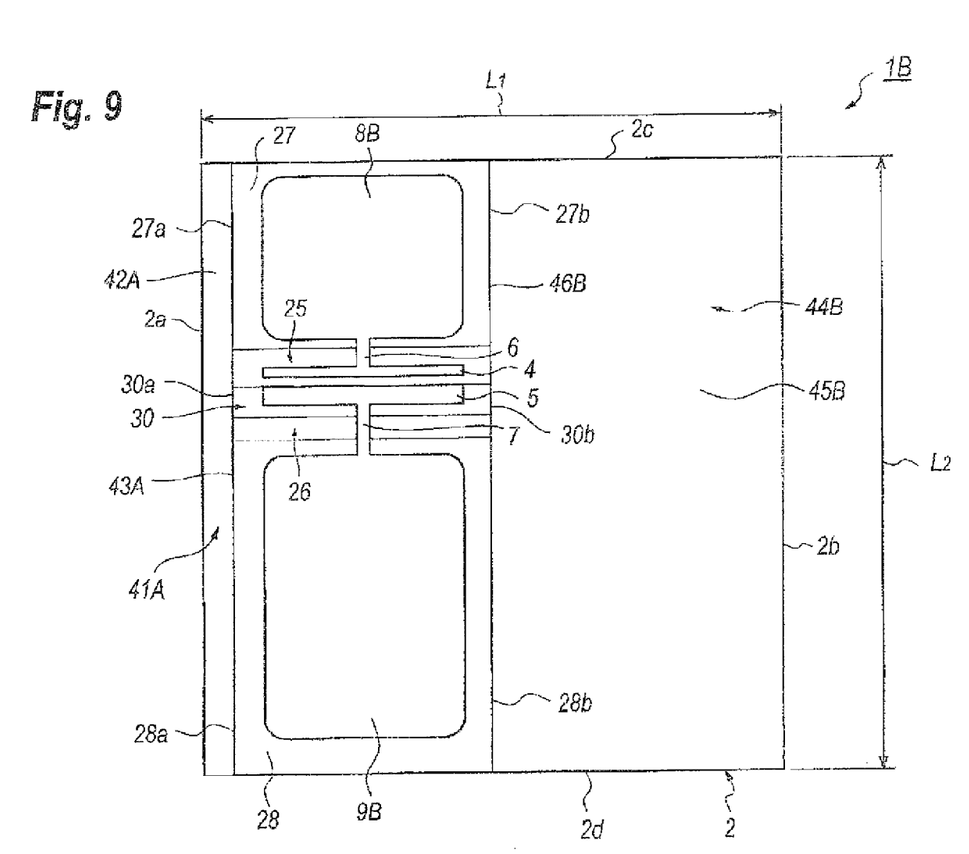
FIG. 9 is a plan view of still another LD according to the third embodiment.

FIG. 9 is a plan view of still another LD 1B according to the third embodiment of the present application. The LD 1B shown in FIG. 9 has a feature, in addition to those of the second embodiment shown in FIGS. 7 and 8, that the depression 44B extends in a whole of the edge 2b, that is, the depression 44B extends from the edge 2c to the other edge 2d. The lateral width of the depression 44B coincides with the lateral width $L_2$ of the LD body 2, which may be, for instance, 400 μm. Also, the facet 30b of the mesa 30 is common to the sides, 27b and 28b, of the areas, 27 and 28, in both sides of the mesa 30 on which the pads, 89 and 9B, are formed. Accordingly, the longitudinal distances between two sides, 27a and 27b, and that between two sides, 28a and 28b, coincide with the length $L_3$ of the mesa 30, which means that the pads, 8B and 9B, in the longitudinal lengths thereof are restricted. However, the LD 1B shown in FIG. 9, in particular, the pads 8B and 9B, have enlarged lateral widths. That is the pad 8B has a square plane shape with chamfered corners, and a lateral width and a longitudinal length are about 50 μm. On the other hand, the other pad 9B, has a rectangular plane shape with an enlarged lateral width of 150 μm and a longitudinal length of about 50 μm. Thus, two pads, 8B and 9B, may enable to be wire-bonded with two or more bonding wires.

Fourth Embodiment

Figure 10:
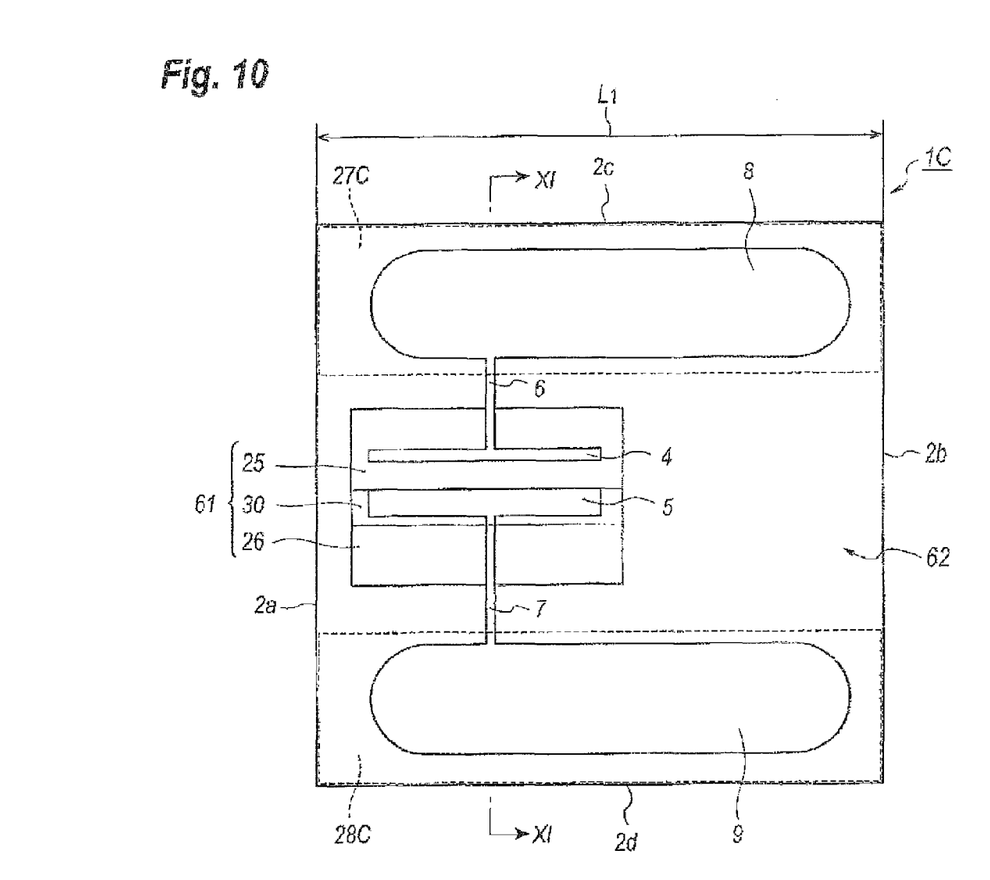
FIG. 10 is a plan view of still another LD according to the fourth embodiment.
Figure 11:
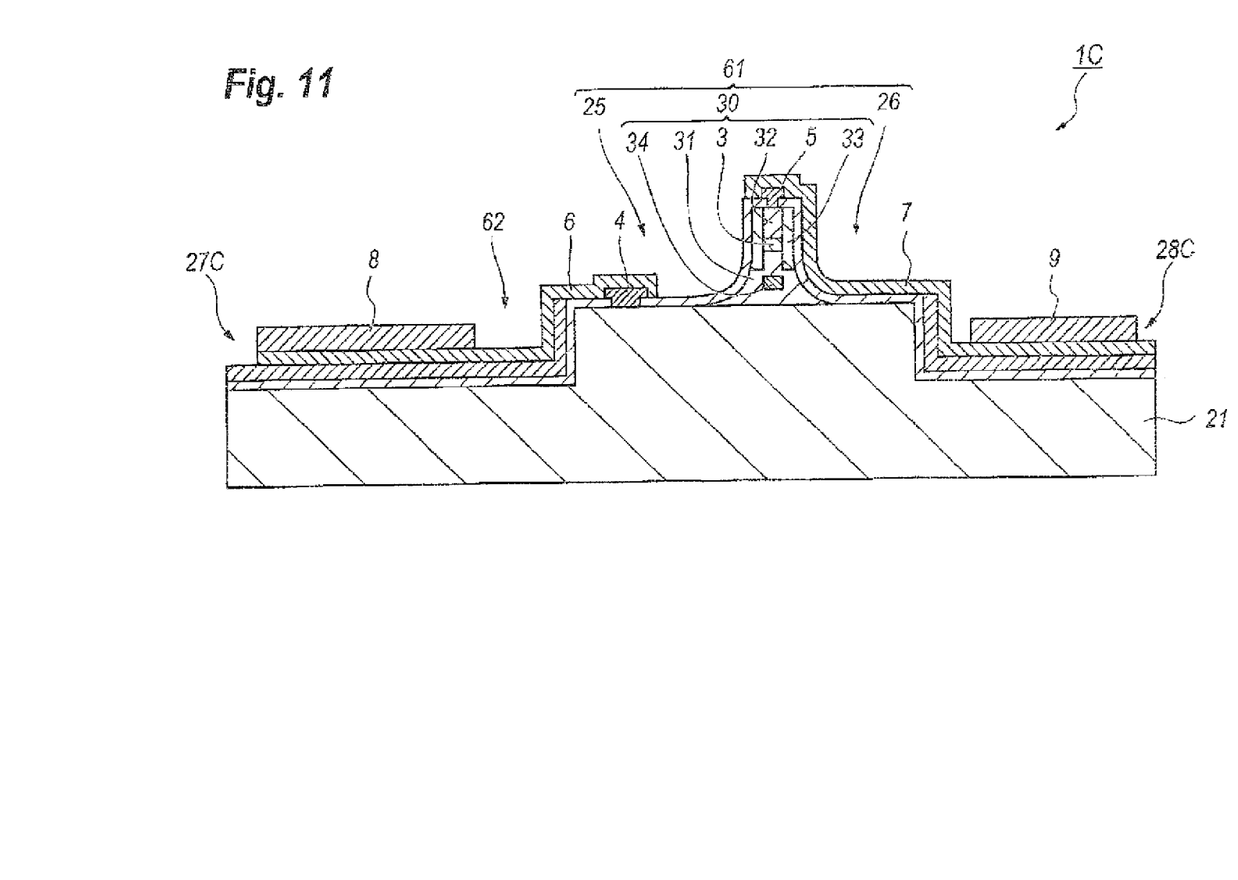
FIG. 11 shows a cross section of the fourth embodiment, which is taken along the line XI-XI appearing in FIG. 10.

FIG. 10 is a plan view of still another LD 1C according to the fourth embodiment of the present application, and FIG. 11 is a cross section thereof taken along the line XI-XI indicated in FIG. 10. The LD 1C shown in FIGS. 10 and 11, has a feature that a primary area 61 including the mesa 30 and two grooves, 25 and 26, is isolated on the semiconductor substrate 21. That is, two depressions, 41 and 44 in the first embodiment, 41A and 44 in the second embodiment and 41A and 44B in the third embodiment, are become one as the depression 62 surrounding the primary area 61. Areas, 27C and 28C, which laterally sandwich the primary area 61 provide the pads, 8 and 9, respectively. Longitudinal lengths between two sides of the respective areas, 27C and 28C, along the optical axis of the LD 1C coincide with the longitudinal length $L_1$ of the LD body 2. Also, the pads, 8 and 9, have horizontal levels thereof lower than the active layer 3. The aforementioned embodiments, 1 to 1B, form the pads, 8 to 9B, after the formation of the mesa 30 but before the formation of the depressions, 41, 41A, 44 and 44B. However, the present embodiment 1C shown in FIGS. 10 and 11 forms the pads, 8 and 9, after the process to form the depression 62 because the process for the depression 62 partially removes the areas, 27C and 28C. The pads, 8 and 9, are necessary to be placed on the depressed areas, 27C and 28C.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. For instance, the LDs, 1 to 1C, may integrally include regions to amplify light generated in the active layer 3, and/or regions to tune emission wavelengths of the LDs, 1 to 1C. Also, when the LDs, 1 to 1C, emit light only from one of the light-emitting facet 3a, the active layer 3 may accompany with a region to absorb light in the side of the light-emitting facet 3b. Also, in the first to third embodiments, the pads, 8 to 9B, are formed before the process to form the depressions, 41 to 44B, however, the pads, 8 to 9B, may be processed after the formation of the depressions, like the fourth embodiment. Also, in the first to fourth embodiments, the electrodes, 4 and 5, are formed after the formation of the grooves, 25 and 26, but before the process to form the depressions, 41 to 41B. However, the process of the present invention may form the electrodes after the formation of the depressions, 41 to 44B and 62.

What is claimed is:

1. A semiconductor laser diode (LD) providing an optical axis along which laser light is emitted, comprising:
   a rectangular semiconductor substrate;
   a mesa including an active layer to generate the laser light, the mesa extending along the optical axis and having two facets in respective ends thereof to define a cavity for the laser light; and
   a depression having a bottom exposing the substrate therein to one of the two facets of the mesa,
   wherein at least one of the two facets of the mesa is stood back from an edge of the substrate perpendicular to the optical axis, and
   wherein a longitudinal length of the mesa between the two facets is substantially equal to a length of the active layer along the optical axis.

2. The LD of claim 1,
   wherein the substrate provides other two edges extending in parallel to each other along the optical axis, the depression extending from one of the other two edges to the other of the other two edges.

3. The LD of claim 1,
   further providing another depression having a bottom exposing the substrate therein to another of the two facets of the mesa.

4. The LD of claim 3,
   wherein the substrate provides other two edges extending in parallel to each other along the optical axis, the depression extending from one of the other two edges to the other of the other two edges.

5. The LD of claim 4,
   wherein the depression continues to the another depression in respective sides of the mesa, the mesa being isolated within the depression and the another depression.

6. The LD of claim 1,
   further providing grooves defining the mesa, the depression being deeper than a depth of the grooves.

7. The LD of claim 6,
   further comprising an electrode in a top of the mesa and another electrode in a bottom of one of the grooves.

8. The LD of claim 6,
   further comprising pads in areas each outside of the grooves with respect to the mesa and outside of the depression.

9. The LD of claim 6,
   further comprising pads in areas each outside of the grooves with respect to the mesa and within the depression.

10. A semiconductor laser diode (LD) providing an optical axis along which laser light is emitted, comprising:
    a rectangular semiconductor substrate;
    a region to generate the laser light, the region stacking a first cladding layer, an active layer, and a second cladding layer in order to layers, the region extending along the optical axis and having two facets in respective ends thereof to define a cavity for the laser light; and
    a depression having a bottom therein exposed to one of the two facets of the region,
    wherein at least one of the two facets of the mesa is stood back from an edge of the substrate perpendicular to the optical axis, and
    wherein a longitudinal length of the region between the two facets is substantially equal to a length of the active layer along the optical axis.

* * * * *